United States Patent
Li et al.

(10) Patent No.: US 12,408,395 B2
(45) Date of Patent: Sep. 2, 2025

(54) SEMICONDUCTOR DEVICE HAVING HIGH DRIVING CAPABILITY AND STEEP SUBTHRESHOLD SWING (SS) CHARACTERISTIC AND METHOD OF MANUFACTURING THE SAME

(71) Applicant: INSTITUTE OF MICROELECTRONICS, CHINESE ACADEMY OF SCIENCES, Beijing (CN)

(72) Inventors: Yongliang Li, Beijing (CN); Xiaohong Cheng, Beijing (CN); Fei Zhao, Beijing (CN); Jun Luo, Beijing (CN); Wenwu Wang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 450 days.

(21) Appl. No.: 18/059,960

(22) Filed: Nov. 29, 2022

(65) Prior Publication Data

US 2023/0261050 A1     Aug. 17, 2023

(30) Foreign Application Priority Data

Feb. 11, 2022    (CN) .......................... 202210131205.8

(51) Int. Cl.
    *H10D 62/10*        (2025.01)
    *H10D 30/01*        (2025.01)
               (Continued)

(52) U.S. Cl.
    CPC ....... *H10D 62/121* (2025.01); *H10D 30/0243* (2025.01); *H10D 30/43* (2025.01);
               (Continued)

(58) Field of Classification Search
CPC .. H10D 30/6735; H10D 30/62; H10D 30/611; H10D 30/43; H10D 62/121; H10D 30/0243; H10D 30/797
See application file for complete search history.

(56) References Cited

U.S. PATENT DOCUMENTS

| | | | |
|---|---|---|---|
| 2020/0118891 A1* | 4/2020 | Cheng | ................. B82Y 10/00 |
| 2020/0295003 A1 | 9/2020 | Dewey et al. | |
| 2022/0093743 A1* | 3/2022 | Wang | ................. H10D 30/014 |

FOREIGN PATENT DOCUMENTS

| | | |
|---|---|---|
| CN | 110660799 A | 1/2020 |
| CN | 112018169 A | 12/2020 |

OTHER PUBLICATIONS

First Chinese Office Action dated Jul. 5, 2025, for corresponding Chinese Patent Application No. 202210131205.8, 13 pgs.

* cited by examiner

*Primary Examiner* — Changhyun Yi
(74) *Attorney, Agent, or Firm* — Kinney & Lange, P.A.

(57) ABSTRACT

A semiconductor device and a method of manufacturing the same are disclosed. The semiconductor device includes: a substrate and a channel portion. The channel portion includes a first portion including a fin-shaped structure protruding with respect to the substrate and a second portion located above the first portion and spaced apart from the first portion. The second portion includes one or more nanowires or nanosheets spaced apart from each other. Source/drain portions are arranged on two opposite sides of the channel portion in a first direction and in contact with the channel portion. A gate stack extends on the substrate in a second direction intersecting with the first direction, so as to intersect with the channel portion.

17 Claims, 17 Drawing Sheets

(51) Int. Cl.
*H10D 30/43* (2025.01)
*H10D 30/60* (2025.01)
*H10D 30/62* (2025.01)
*H10D 30/67* (2025.01)

(52) U.S. Cl.
CPC .......... *H10D 30/611* (2025.01); *H10D 30/62* (2025.01); *H10D 30/6735* (2025.01)

SEMICONDUCTOR DEVICE HAVING HIGH DRIVING CAPABILITY AND STEEP SUBTHRESHOLD SWING (SS) CHARACTERISTIC AND METHOD OF MANUFACTURING THE SAME

CROSS-REFERENCE TO RELATED APPLICATION

This application claims the benefit of Chinese Patent Application No. 202210131205.8, filed on Feb. 11, 2022 in the China National Intellectual Property Administration, the whole disclosure of which is incorporated herein by reference.

TECHNICAL FIELD

The present disclosure relates to a field of semiconductors, and more particularly, to a semiconductor device having a high driving capability and a steep subthreshold swing (SS), and a method of manufacturing the same.

BACKGROUND

A fin field effect transistor (FinFET) is currently a mainstream device. However, with a further miniaturization of the device, a gate control capability of the device is weakened, a short channel effect becomes worse, characterized in that a subthreshold swing (SS) becomes worse, a leakage current increases, and especially a power consumption of the device during a switching process becomes larger. In order to improve a performance of the device, a nanowire or nanosheet gate-all-around device may be used. The gate-all-around (GAA) device, especially the nanowire gate-all-around device, has a significantly improved SS, but a driving performance thereof is reduced. In order to improve the driving performance, a stack of more nanowires (which has a great process difficulty) or a parallel arrangement of more devices (which occupies a larger area) is required.

SUMMARY

In view of this, an objective of the present disclosure is, at least in part, to provide a semiconductor device having a high driving capability while having a steep subthreshold swing (SS), and a method of manufacturing the same.

According to an aspect of the present disclosure, a semiconductor device is provided, including: a substrate; a channel portion, including: a first portion including a fin-shaped structure protruding with respect to the substrate; a second portion located above the first portion and spaced apart from the first portion, wherein the second portion includes one or more nanowires or nanosheets spaced apart from each other; source/drain portions arranged on two opposite sides of the channel portion in a first direction and being in contact with the channel portion; and a gate stack extending on the substrate in a second direction intersecting with the first direction, so as to intersect with the channel portion.

According to another aspect of the present disclosure, a method of manufacturing a semiconductor device is provided, including: arranging a ridge-shaped structure extending along a first direction on the substrate, wherein the ridge-shaped structure includes a first stacked layer of a first plurality of semiconductor layers at least on an upper portion of the ridge-shaped structure; forming a dummy gate extending in a second direction intersecting with the first direction on the substrate, so as to intersect with the ridge-shaped structure; forming an interlayer dielectric layer on the substrate, wherein the interlayer dielectric layer exposes the dummy gate; removing the dummy gate to form a gate trench in the interlayer dielectric layer; removing a portion of the semiconductor layer from the first stacked layer of the ridge-shaped structure in the gate trench to form one or more nanowires or nanosheets separated from each other, wherein a lower portion of the ridge-shaped structure is separated from the nanowires or nanosheets to form a fin-shaped structure; and forming a gate stack in the gate trench so as to intersect with the nanowires or nanosheets and the fin-shaped structure.

According to yet another aspect of the present disclosure, an electronic apparatus is provided, including the above-mentioned semiconductor device.

According to the embodiments of the present disclosure, the semiconductor device may resemble the fin field effect transistor (FinFET) in the lower portion and may resemble the gate-all-around (GAA) nanowire or nanosheet device in the upper portion. During the switching process, advantages of the upper GAA device may be used to obtain a steeper SS, so that the leakage current is reduced and the power consumption is decreased. When fully conducted, the lower FinFET and the upper GAA device may provide the conduction current together, thereby achieving a larger current than the situation in which the device completely adopts the GAA structure, thus improving the driving performance of the device. Therefore, performances such as power consumption and speed of the semiconductor device according to the embodiments of the present disclosure or an integrated circuit (IC) chip including the semiconductor device are improved. In addition, the manufacturing method according to the embodiments of the present disclosure is compatible with the mainstream FinFET process, not much different from the process of the GAA device, and may be achieved by adding few process steps.

BRIEF DESCRIPTION OF THE DRAWINGS

The above and other objectives, features and advantages of the present disclosure will become more apparent through the following descriptions of the embodiments of the present disclosure with reference to the accompanying drawings, in the drawings:

FIG. 1, FIG. 2 (a), FIG. 2 (b), FIG. 3 (a), FIG. 3 (b), FIG. 4 (a), FIG. 4 (b), FIG. 5 (a), FIG. 5 (b), FIG. 5 (c), FIG. 6 (a), FIG. 6 (b), FIG. 6 (c), FIG. 7 (a), FIG. 7 (b), FIG. 7 (c), FIG. 8 (a), FIG. 8 (b), FIG. 9 (a), FIG. 9 (b), FIG. 10 (a), FIG. 10 (b), FIG. 11 (a), FIG. 11 (b), and FIG. 11 (c) schematically illustrate some stages in a process of manufacturing a semiconductor device according to an embodiment of the present disclosure;

FIG. 12 (a), FIG. 12 (b), FIG. 13 (a), and FIG. 13 (b) schematically illustrate some stages in a process of manufacturing a semiconductor device according to another embodiment of the present disclosure; and FIG. 14 to FIG. 17 schematically illustrate some stages in a process of manufacturing a semiconductor device according to yet another embodiment of the present disclosure, wherein.

FIGS. 1, 3(a), 4(a), 5(b), 6(b), 7(b), 8(a), 9(a), 10(a), 11(b), 12(a) and 13(a) are cross-sectional views taken along line AA'; and FIGS. 3(b), 4(b), 5(c), 6(c), 7(c), 8(b), 9(b), 10(b), 11(c), 12(b), 13(b) and 14 to 17 are cross-sectional views taken along line BB'.

DETAILED DESCRIPTION OF EMBODIMENTS

Figure 1:
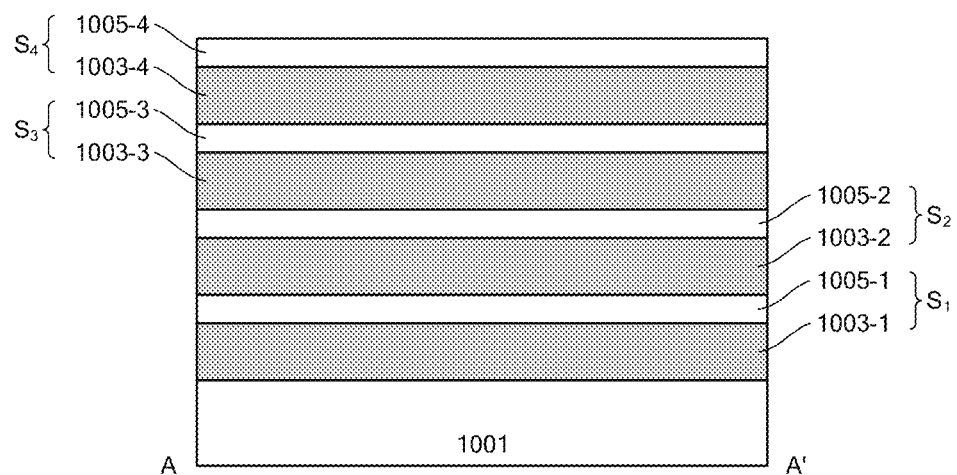

Hereinafter, the embodiments of the present disclosure will be described with reference to the accompanying drawings. However, it should be understood that these descriptions are only exemplary, and are not intended to limit the scope of the present disclosure. Additionally, in the following descriptions, descriptions of well-known structures and technologies are omitted to avoid unnecessarily obscuring the concept of the present disclosure.

Various schematic structural diagrams according to the embodiments of the present disclosure are shown in the accompanying drawings. These drawings are not drawn to scale, some details are enlarged for the purpose of a clear expression, and some details may be omitted. Various regions, shapes of layers as well as relative sizes and positional relationships therebetween shown in the drawings are only exemplary. In an actual practice, there may be deviations due to manufacturing tolerances or technical limitations, and those skilled in the art may additionally design regions/layers having different shapes, sizes and relative positions as required. In the context of the present disclosure, when a layer/an element is referred to as being "above" another layer/element, the layer/element may be directly on the other layer/element or an intervening layer/element may exist therebetween. In addition, if a layer/an element is "above" another layer/element in one orientation, the layer/element may be "below" the other layer/element when the orientation is reversed.

According to the embodiments of the present disclosure, there is provided a semiconductor device. The semiconductor device according to the embodiments of the present disclosure may include a channel portion and source/drain portions on two opposite sides of the channel portion. The source/drain portions may be electrically communicated through the channel portion. The channel portion may exhibit different forms in an upper portion and a lower portion, respectively. Specifically, the upper portion of the channel portion may include (one) nanowire or nanosheet or (more) nanowires or nanosheets spaced apart from each other, and the lower portion of the channel portion may include a fin-shaped structure protruding with respect to a substrate. The fin-shaped structure may be integral, or a stacked player of a plurality of semiconductor layers, such as an alternating stack of two or more semiconductor layers. The nanowire or nanosheet in the upper portion of the channel portion may contain the same semiconductor material as the lower portion or partial layers in the lower portion of the channel portion. Additionally, the upper portion and the lower portion of the channel portion may be self-aligned in a vertical direction.

A gate stack may be formed to intersect with the channel portion. On one hand, the gate stack may surround the nanowire or nanosheet in the upper portion of the channel portion to form a gate-all-around (GAA) configuration, thereby achieving a steeper subthreshold swing (SS) characteristic. On the other hand, the gate stack may cover a sidewall (and optionally, a top surface) of the fin-shaped lower portion of the channel portion, so as to resemble a fin field effect transistor (FinFET) configuration, thereby achieving a higher driving performance.

Such a semiconductor device may be manufactured, for example, as follows. A ridge-shaped structure extending in a first direction may be arranged on the substrate. The ridge-shaped structure includes, at least in the upper portion, a stacked layer of several semiconductor layers, e.g. an alternating stack of two (or more) semiconductor layers having etching selectivity with respect to each other, so that a channel portion in a form of a separated nanosheet or a nanosheet may be subsequently released in the upper portion. The ridge-shaped structure may be similarly in a form of a stacked layer of semiconductor layers in the lower portion (having the same or similar configuration as, or may have different configurations from those of the semiconductor layers in the upper portion), or may also be integral.

The semiconductor device may be manufactured on a basis of such ridge-shaped structure. A manufacturing method according to the embodiments of the present disclosure may be compatible with a mainstream FinFET process because such ridge-shaped structure is similar to a fin.

For example, a dummy gate extending in a second direction intersecting with (e.g., perpendicular to) the first direction may be formed on the substrate. A portion of the ridge-shaped structure covered by the dummy gate may then be used to define the channel portion. The source/drain portions may be formed on two opposite sides of the dummy gate in the first direction. For example, the source/drain portions may be formed by ion implantation into a portion of the ridge-shaped structure exposed by the dummy gate, or may be formed by etching the ridge-shaped structure by using the dummy gate as a mask, and additionally growing an epitaxial layer (doping in situ being performed during the growth).

After that, an interlayer dielectric layer may be formed on the substrate to cover the source/drain portions and expose the dummy gate, so that a gate replacement process is performed. In the gate replacement process, the dummy gate may be removed so that a gate trench may be formed in the interlayer dielectric layer, and thus the portion of the ridge-shaped structure previously covered by the dummy gate (a portion between the source/drain portions) may be exposed to define the channel portion. A difference from the FinFET process is that here, one or more semiconductor layers may be released in the upper portion of the ridge-shaped structure. Here, the "release" may refer to separating a corresponding semiconductor layer from other semiconductor layers between the source/drain portions. In this way, the gate stack formed subsequently may surround the released semiconductor layer. The lower portion of the ridge-shaped structure may remain substantially unaffected and thus form the fin-shaped structure. Correspondingly, the channel portion may include the fin-shaped structure in the lower portion and one or more (separated) nanowires or nanosheets above the fin-shaped structure and separated from the fin-shaped structure.

The gate stack may be formed to intersect with the channel portion. More specifically, the gate stack may be formed in the gate trench and thus may surround the nanowire or nanosheet in the upper portion of the channel portion, and may cover the top surface and the sidewall (in the second direction) of the fin-shaped structure in the lower portion of the channel portion. Gate stacks of different configurations may be respectively formed for the upper portion and the lower portion of the channel portion.

The present disclosure may be presented in various forms, some examples thereof will be described below. In the following descriptions, a selection of various materials is involved. The selection of the material takes into account etching selectivity in addition to a function thereof (for example, a semiconductor material is used to form an active region, and a dielectric material is used to form an electrical isolation). In the following descriptions, a desired etching selectivity may or may not be indicated. Those skilled in the art should be clear that when it is mentioned below that a certain material layer is etched, if it is not mentioned that another layer is also etched or it is not shown in the drawings that another layer is also etched, then the etching may be selective, and the material layer may have etching selectivity relative to other layers exposed to a same etching recipe.

FIG. 1 to FIG. 11(c) schematically illustrate some stages in a process of manufacturing a semiconductor device according to an embodiment of the present disclosure.

As shown in FIG. 1, a substrate 1001 is provided. The substrate 1001 may be a substrate of various forms, including but not limited to a bulk semiconductor material substrate such as bulk Si substrate, a semiconductor-on-insulator (SOI) substrate, a compound semiconductor substrate such as a SiGe substrate or the like. In the following descriptions, for ease of description, a bulk Si substrate is used as an example for description. Here, a silicon wafer is provided as the substrate 1001.

A plurality of stacked layers $S_1$, $S_2$, $S_3$ and $S_4$ may be formed on the substrate 1001, each stacked layer includes a stack of two or more semiconductor layers. For example, as shown in FIG. 1, a first stacked layer $S_1$ may include a stack of a first semiconductor layer 1003-1 and a second semiconductor layer 1005-1, a second stacked layer $S_2$ may include a stack of a first semiconductor layer 1003-2 and a second semiconductor layer 1005-2, a third stacked layer $S_3$ may include a stack of a first semiconductor layer 1003-3 and a second semiconductor layer 1005-3, and a fourth stacked layer $S_4$ may include a stack of a first semiconductor layer 1003-4 and the second semiconductor layer 1005-4. That is, in this example, the stacked layers $S_1$, $S_2$, $S_3$ and $S_4$ are achieved by alternately arranging the first semiconductor layers and the second semiconductor layers, which is convenient in process.

Here, four stacked layers $S_1$, $S_2$, $S_3$ and $S_4$ are shown. However, the present disclosure is not limited to this. For example, more or fewer stacked layer may be formed. In addition, it is not limited that two semiconductor layers are included in each stacked layer, and more semiconductor layers may be included. Thicknesses of the various semiconductor layers in each stacked layer may be the same or different, and the thicknesses of the semiconductor layers in different stacked layers may be the same or different.

Here, M (M=2 in the example of FIG. 1) stacked layers (i.e., $S_1$ and $S_2$) in the lower portion may subsequently be used to define the fin, and N (N=2 in the example of FIG. 1) stacked layers (i.e., $S_3$ and $S_4$) in the upper portion may subsequently be used to define the nanowire or nanosheet. Values of M and N may be set differently depending on a device design.

These semiconductor layers may be formed on the substrate 1001 by, for example, epitaxial growth. Correspondingly, each semiconductor layer may have a good crystal quality and may be of a single crystal structure. There may be etching selectivity between adjacent semiconductor layers among these semiconductor layers. In the case that the substrate 1001 is the silicon wafer, each stacked layer may be a Si/$Si_{1-x}Ge_x$ stacked layer, a Si/Ge stacked layer, a $Si_{1-x}Ge_x$/Ge stacked layer, or the like (0<x<1). For example, the first semiconductor layers 1003-1, 1003-2, 1003-3 and 1003-4 may contain $Si_{1-x}Ge_x$ (0<x<1), and the second semiconductor layers 1005-1, 1005-2, 1005-3 and 1005-4 may contain Si. Generally, each semiconductor layer is not intentionally doped. According to other embodiments of the present disclosure, each semiconductor layer may also be in-situ doped during epitaxial growth to achieve certain doping characteristics. For example, the doping characteristics in the channel portion (which is subsequently formed by some portions of these semiconductor layers) may achieve an adjustment to a threshold voltage (Vt).

In this example, each stacked layer has the same or similar configuration. For example, each stacked layer includes two semiconductor layers, and the corresponding first semiconductor layer in each stacked layer may contain the same material (and may have the same thickness) and the corresponding second semiconductor layers may also contain the same material (and may have the same thickness). However, the present disclosure is not limited to this. For example, some stacked layers may have different configurations in, for example, at least one aspect of the number of the stacked semiconductor layers, the materials of the semiconductor layers, and the thicknesses of the semiconductor layers. In particular, the M stacked layers (i.e., $S_1$ and $S_2$) in the lower portion and the N stacked layers (i.e., $S_3$ and $S_4$) in the upper portion may have different configurations, and even the M stacked layers in the lower portion may be achieved through a single layer (e.g., Si layer).

Subsequent processes may be performed as conventional manufacturing processes of a GAA nanowire or nanosheet device until the channel portion is released.

Figure 2A:
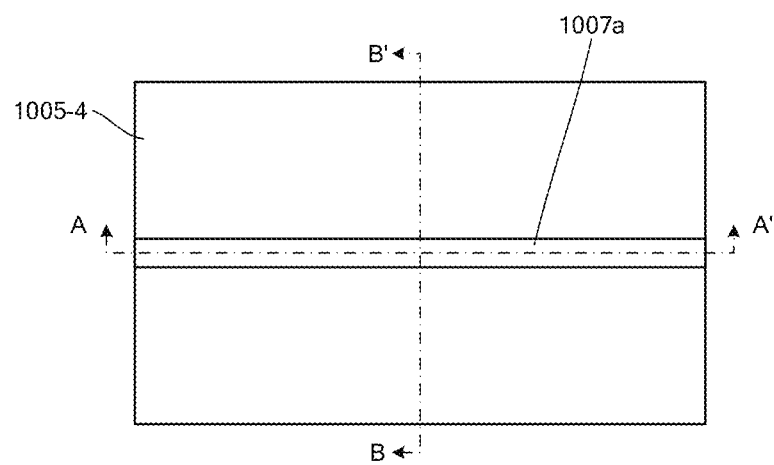
FIGS. 2(a), 2(b), 5(a), 6(a), 7(a) and 11(a) are top views, in which positions of line AA' and line BB' are respectively illustrated.
Figure 2B:
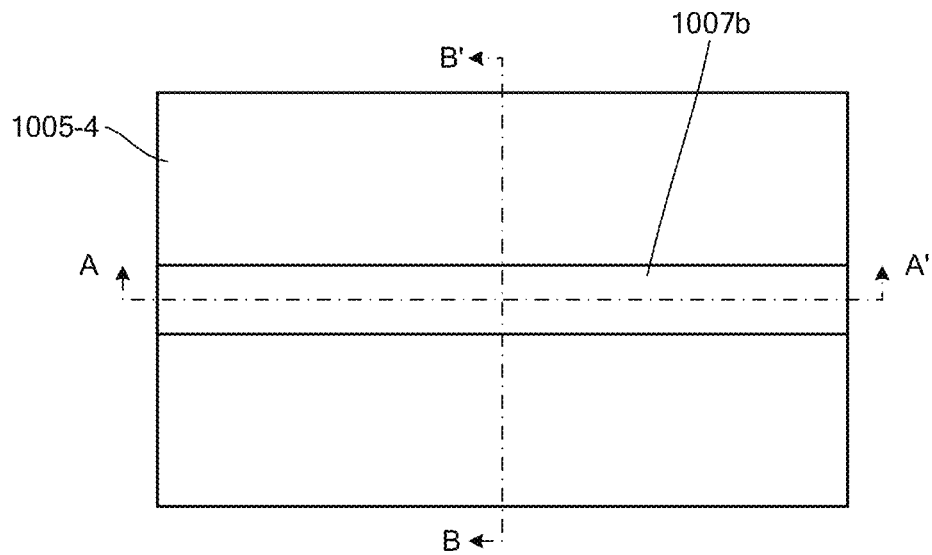

For example, as shown in FIG. 2(a) and FIG. 2(b), a mask layer 1007a or 1007b may be formed on the above stacked layer, the mask layer 1007a or 1007b are patterned in a form of a nanowire (FIG. 2(a)) or a nanosheet (FIG. 2(b)), such as a line shape or a strip shape extending in a horizontal direction (which may be referred to as a "first direction") in the drawing. For example, the mask layer 1007a or 1007b may include a photoresist, a hard mask (e.g., an oxide, a nitride, or a stacked layer thereof) or the like. In the following descriptions, a situation of the nanosheet is mainly taken as an example, however, these descriptions are equally applicable to a situation of the nanowire.

Figure 3A:
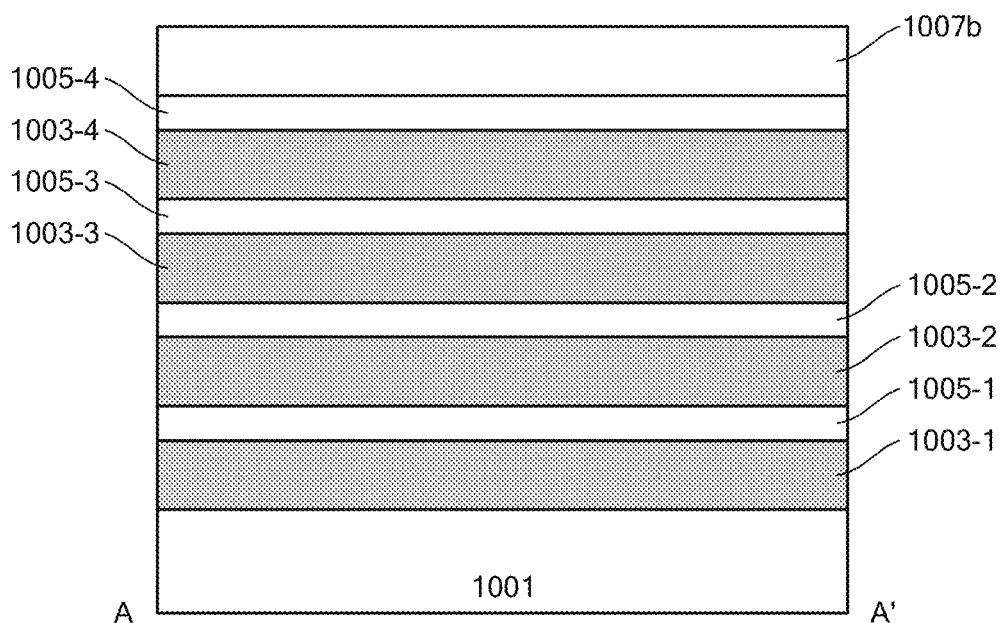
Figure 3B:
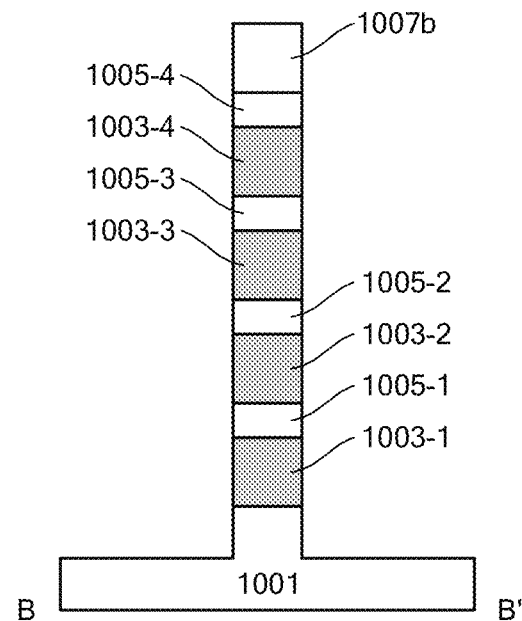

Then, as shown in FIG. 3(a) and FIG. 3(b), the mask layer 1007a or 1007b may be used as an etching mask to selectively etch various layers on the substrate 1001 in sequence by, for example, reactive ion etching (RIE) in a vertical direction or a self-aligned dual patterning (SADP) technology. In addition, the etching may proceed into the substrate 1001 to form a trench in the substrate 1001 for subsequently forming an isolation. In this way, each layer on the substrate 1001 is patterned into a ridge-shaped structure corresponding to the mask layer 1007a or 1007b. After that, the mask layer 1007a or 1007b may be removed as needed.

Figure 4A:
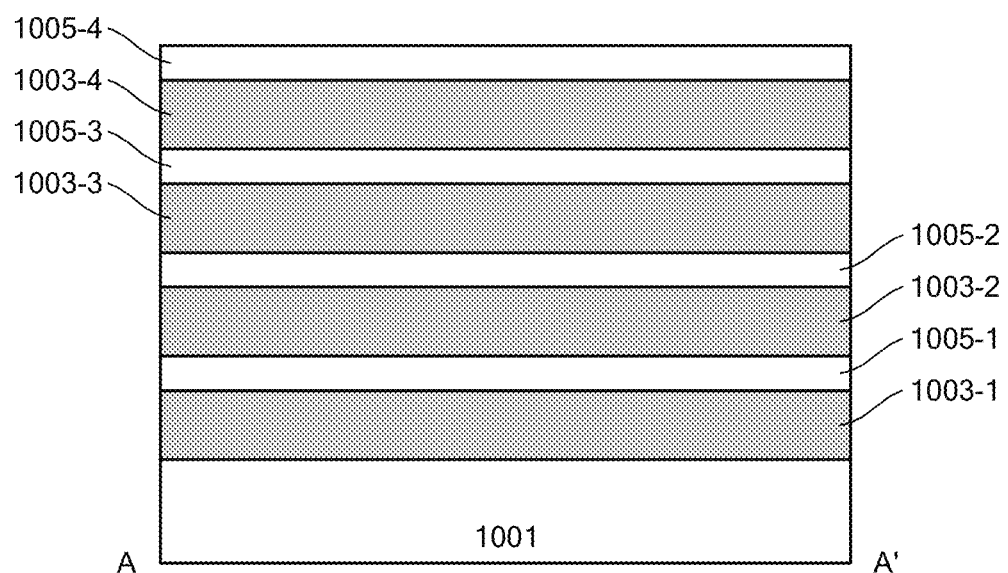
Figure 4B:
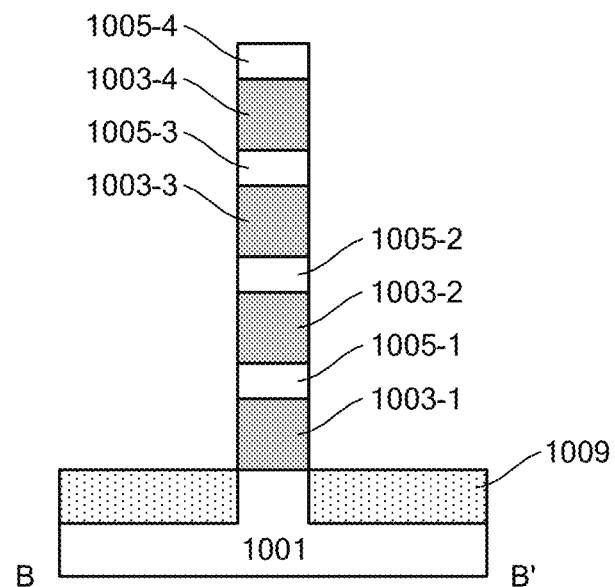

For the purpose of an electrical isolation, as shown in FIG. 4(a) and FIG. 4(b), an isolation portion 1009, such as a shallow trench isolation (STI), may be formed on the substrate 1001, such as in the trench described above. The isolation portion 1009 may achieve an electrical isolation of the device, and may include, for example, an oxide (e.g., silicon oxide). For example, an isolation portion 1021 may be formed by depositing an oxide on the substrate 1001, performing a planarization process such as chemical mechanical polishing (CMP) on the deposited oxide, and performing etching back such as RIE on the planarized oxide.

Figure 5A:
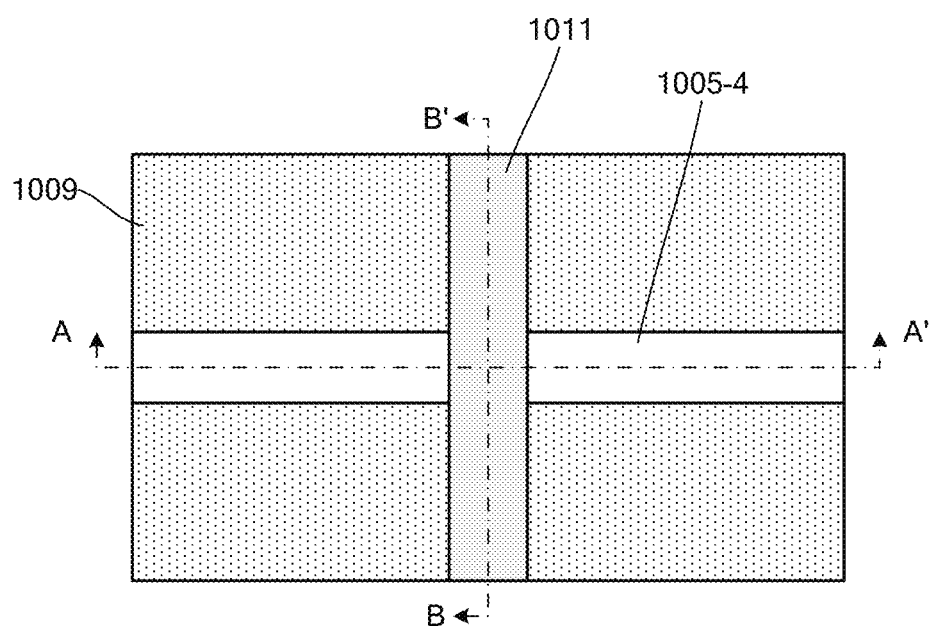
Figure 5B:
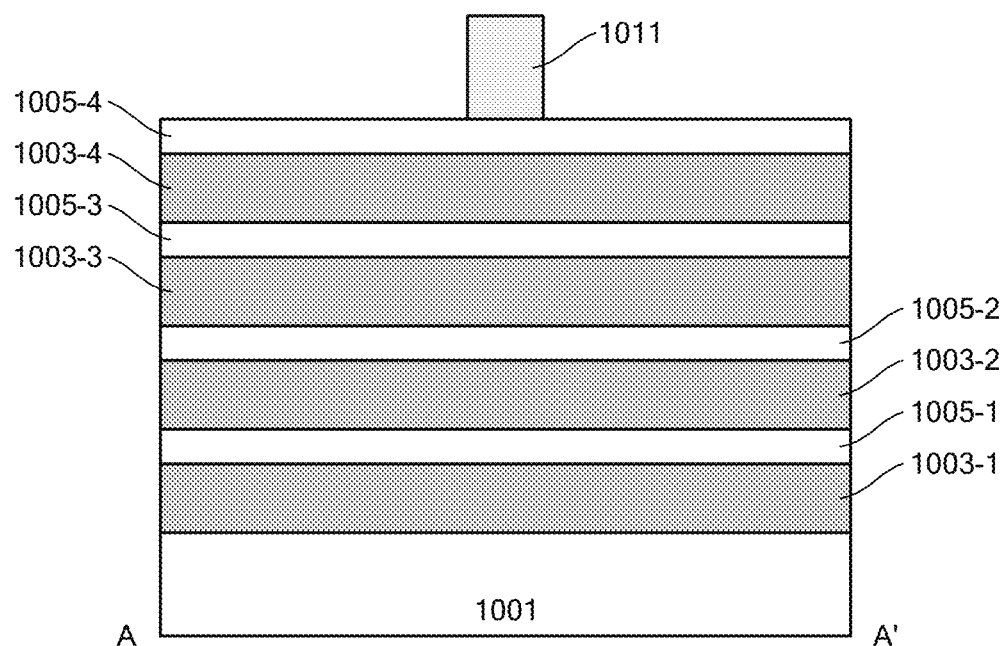
Figure 5C:
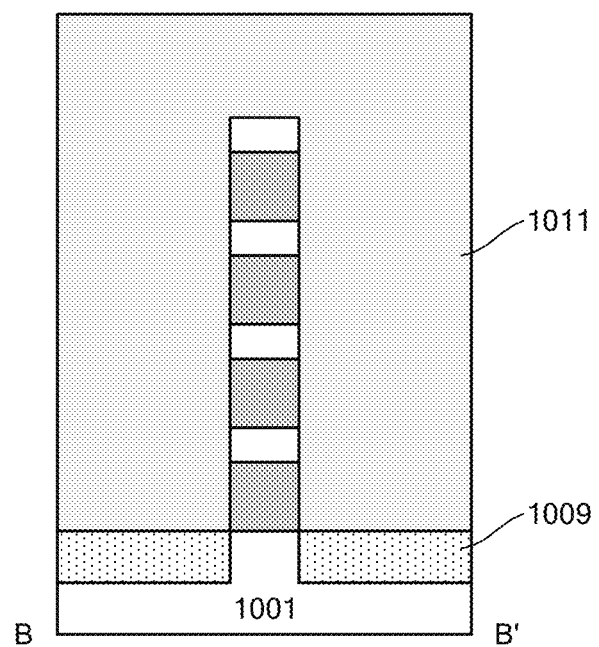

As shown in FIG. 5(a), FIG. 5(b) and FIG. 5(c), on the isolation portion 1009, a dummy gate 1011 extending along a second direction (e.g., a vertical direction in a paper surface in FIG. 5(a), a direction perpendicular to a paper surface in FIG. 5(b), and a horizontal direction in a paper surface in FIG. 5 (c)) intersecting with (for example, perpendicular to) the first direction to intersect with the ridge-shaped structure. The dummy gate 1011 may contain a material having etching selectivity with respect to the ridge-shaped structure, such as polysilicon, amorphous silicon or the like. A pattern of the dummy gate 1011 (a hard mask is also formed on the dummy gate generally, which is not shown in the drawing) may be used as a mask to perform ion implantation on the ridge-shaped structure, so as to achieve required source/drain doping characteristics.

In addition, a spacer (not shown in the drawing) may also be formed on the sidewall of the dummy gate. The spacer and a method of manufacturing the spacer may be the same as those in the conventional technology, which are not repeated here.

Figure 6A:
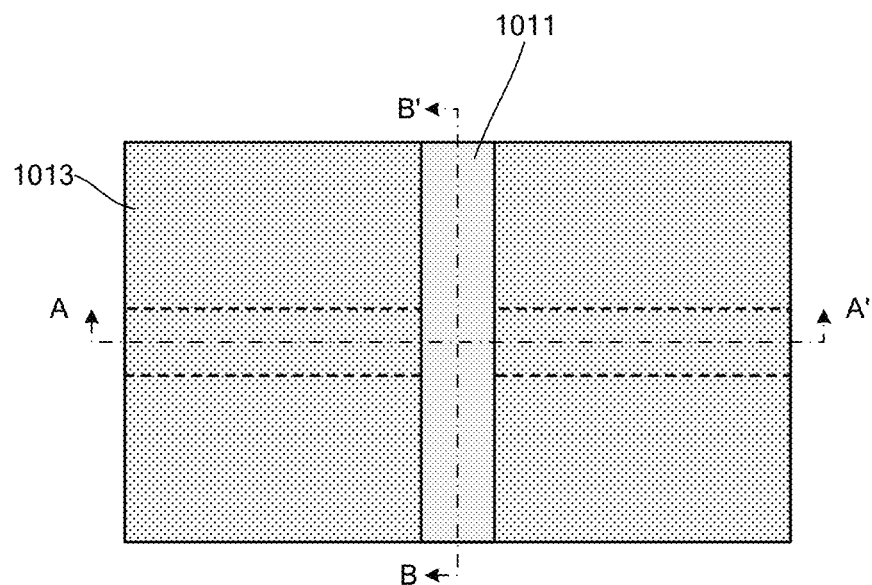
Figure 6B:
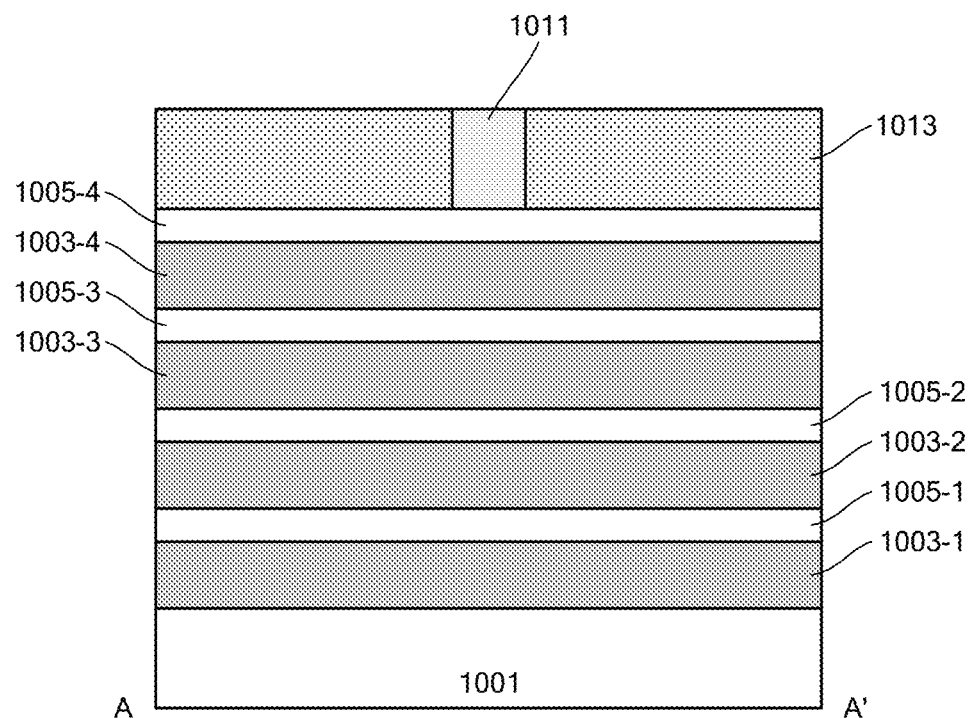
Figure 6C:
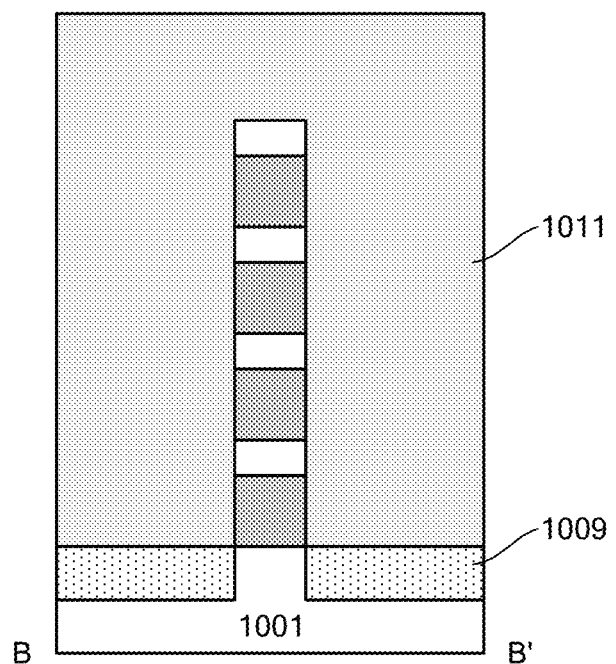

As shown in FIG. 6(a), FIG. 6(b) and FIG. 6(c), an interlayer dielectric layer 1013 may be formed on the substrate 1001. For example, the interlayer dielectric layer 1013 may be formed by depositing an oxide and performing a planarization process on the deposited oxide such as CMP. The dummy gate 1011 may be used as a stop point for CMP to expose the dummy gate 1011.

Here, the interlayer dielectric layer 1013 is directly formed so as to cover portions of the ridge-shaped structure on two opposite sides (left and right sides in FIG. 6(a) and FIG. 6 (b)) of the dummy gate 1011, these covered portions of the ridge-shaped structure may subsequently be used as the source/drain portions of the device. However, the present disclosure is not limited to this. For example, before the interlayer dielectric layer 1013 is formed, the dummy gate 1011 (as well as the hard mask thereon and the spacer on the sidewall thereof) may be used as a mask to selectively etch each stacked layer, so that each stacked layer remains below the dummy gate 1011 (and the spacer on the sidewall thereof). Additional source/drain portions may be formed by epitaxial growth on sidewalls of each stacked layer on two opposite sides of the dummy gate 1011. Materials of the grown source/drain portions may be selected to optimize the device performance. For example, semiconductor materials having different lattice constants may be selected so as to apply a stress to the channel portion achieved in each stacked layer.

Figure 7A:
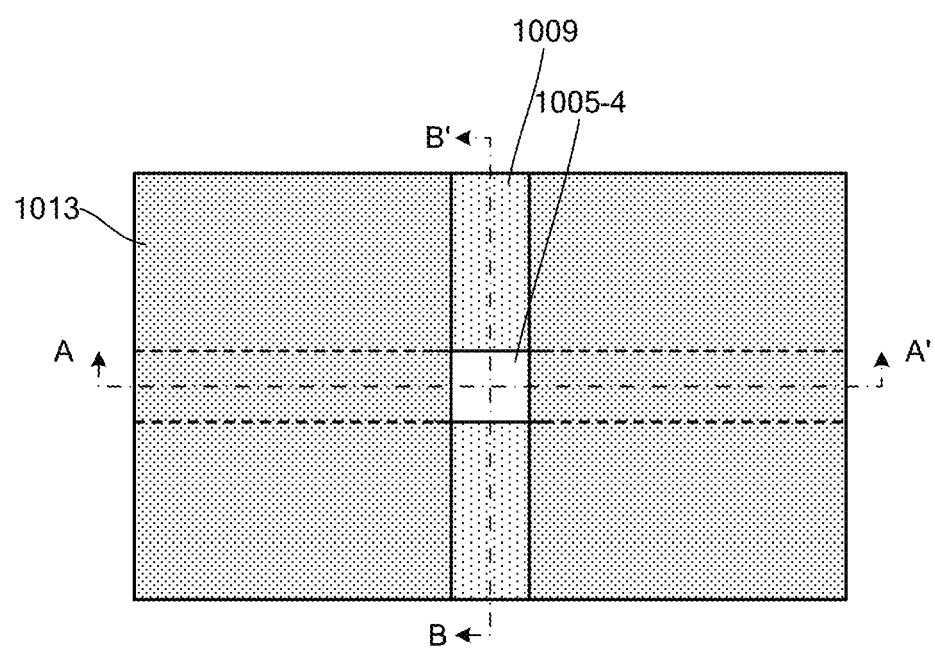
Figure 7B:
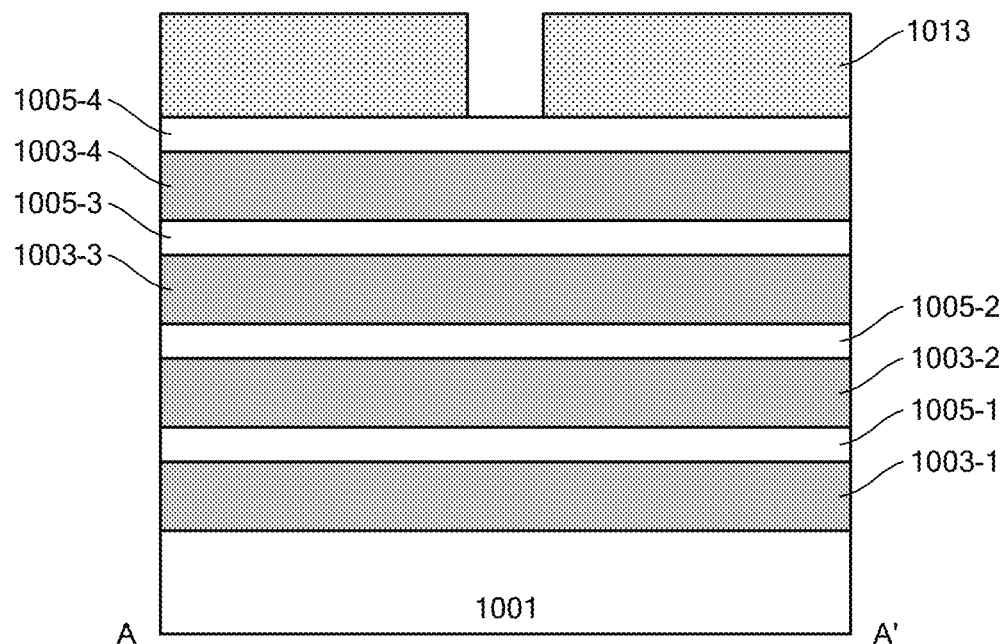
Figure 7C:
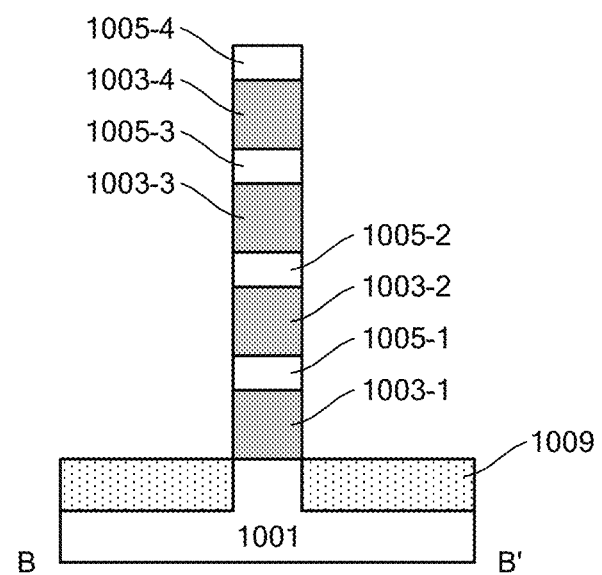

As shown in FIG. 7(a), FIG. 7(b) and FIG. 7(c), the dummy gate 1011 may be removed by selective etching, so that a gate trench (a space originally occupied by the dummy gate 1011) is formed in the interlayer dielectric layer 1013. Therefore, the portion of the ridge-shaped structure previously covered by the dummy gate 1011 may be exposed. This portion may be used to define the channel portion.

Next, an operation of releasing the channel portion may be performed. In the GAA nanowire or nanosheet device, in order to achieve the GAA configuration, a certain space is required to be released around the channel portion in the form of the nanowire or nanosheet, so that a gate stack subsequently formed in the space may surround the channel portion in the form of the nanowire or nanosheet. This is the operation of so-called "releasing the channel portion".

Unlike the conventional process of manufacturing the GAA nanowire or nanosheet, according to the embodiments of the present disclosure, the operation of releasing the channel portion may be performed only on the N stacked layers (i.e., $S_3$ and $S_4$) in the upper portion, and not on the M stacked layers (i.e., $S_1$ and $S_2$) in the lower portion. It should be noted that the values of M and N may be set differently depending on the device design, and may be smaller (e.g., 1) or larger.

Figure 8A:
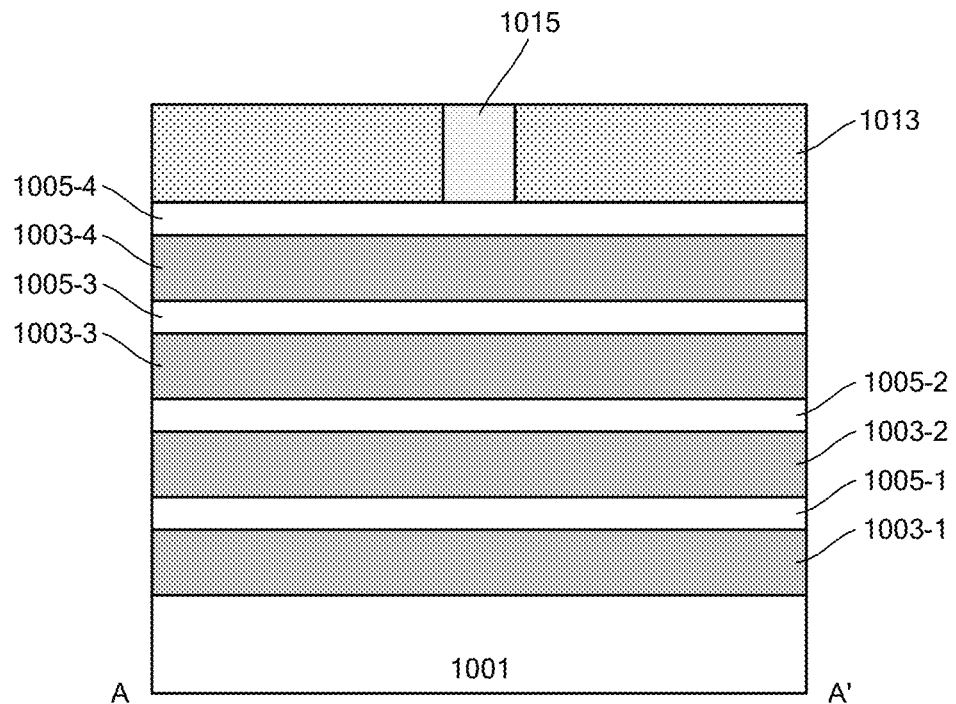
Figure 8B:
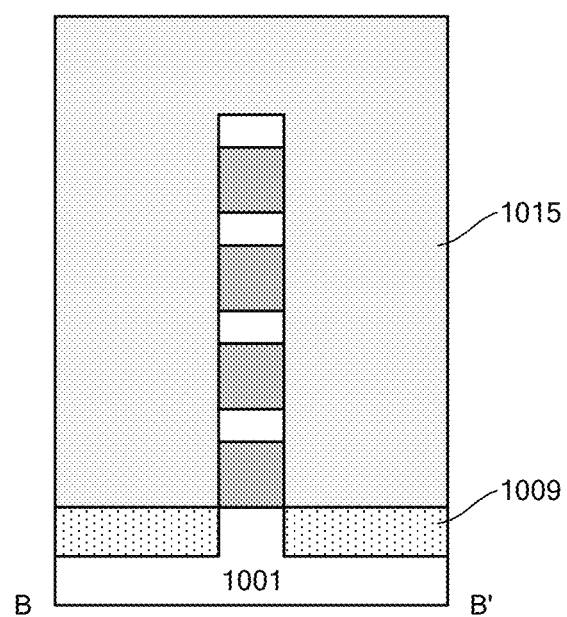

In order to treat the upper portion and the lower portion differently, as shown in FIG. 8(a) and FIG. 8(b), a mask layer 1015 may be formed on the substrate. The mask layer 1015 may have etch selectivity with respect to the interlayer dielectric layer 1013 and the isolation portion 1009 (and each semiconductor layer in the ridge-shaped structure), and the mask layer may contain, for example, spin-on carbon (SOC), advanced patterning film (APF), amorphous silicon, or the like. The mask layer 1015 may be formed in the gate trench. For example, a mask material may be deposited to sufficiently fill the space left in the interlayer dielectric layer 1013 due to the removal of the dummy gate 1011, and a planarization process such as CMP may be performed on the deposited mask material. The CMP may be stopped at the interlayer dielectric layer 1013, so that the mask layer 1015 is formed.

It should be noted that, in the embodiment, the mask layer 1015 is re-formed after the dummy gate 1011 is removed. However, the present disclosure is not limited to this. For example, the dummy gate 1011 may be directly used as a mask without additionally forming the mask layer 1015. Alternatively, according to another embodiment, in the situation that the etching recipe used in the operation of releasing the channel portion is selective for each semiconductor layer in the M stacked layers in the lower portion (or for a single semiconductor layer in the situation that the lower portion is a single semiconductor layer), the operation of releasing the channel portion may be directly performed after the dummy gate 1011 is removed without forming a mask layer.

Figure 9A:
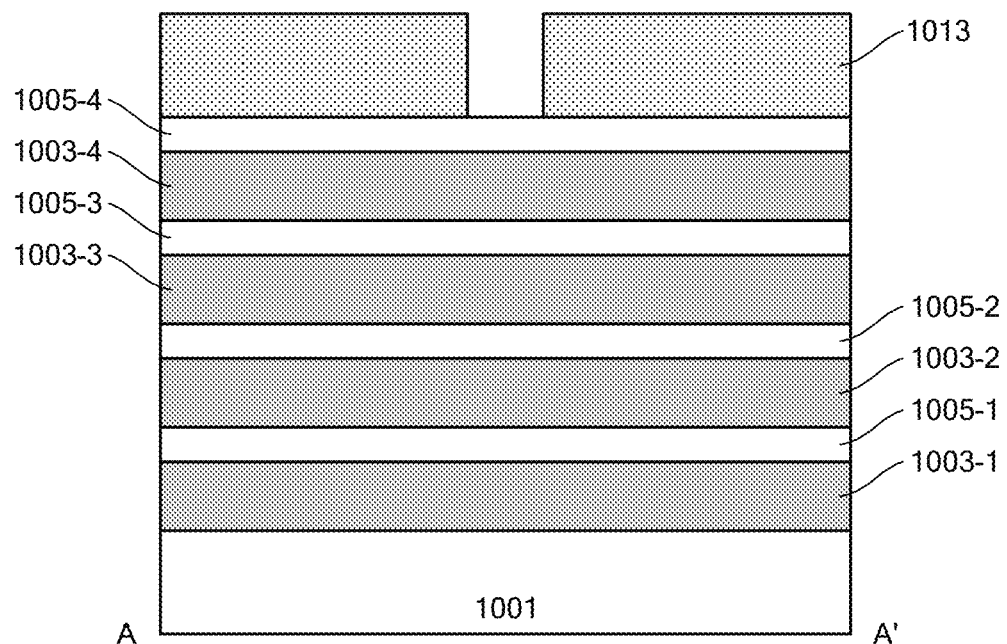
Figure 9B:
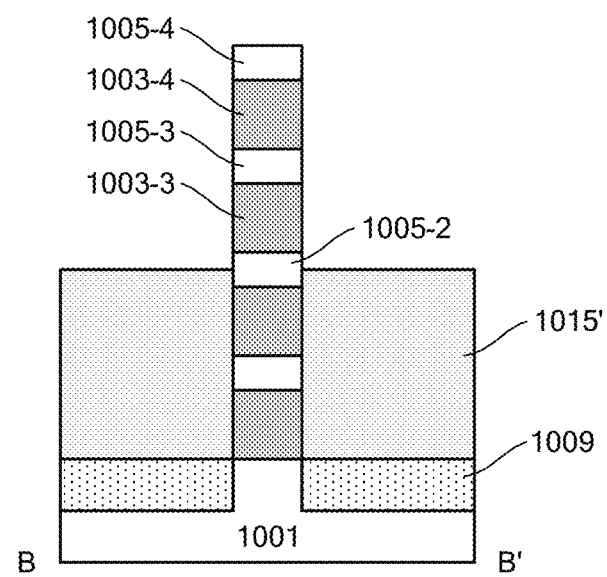

As shown in FIG. 9(a) and FIG. 9(b), for the mask layer 1015 formed in this way an etching back may be performed to lower its top surface and thus the N stacked layers (i.e., $S_3$ and $S_4$) in the upper portion are exposed. A dry etching process such as RIE or a wet etching process may be used for the etching back. The etching recipe used may not only have a certain selectivity to the interlayer dielectric layer 1013, but also have a high selectivity (e.g., greater than 20:1) to the exposed stacked layers. In the situation that the mask layer 1015 contains amorphous silicon, an alkaline solution such as ammonia water may be used to perform the wet etching to achieve the high selectivity.

In FIG. 9(b), a top surface of a mask layer 1015' after etching back is shown (slightly) lower than a top surface of the uppermost semiconductor layer 1005-2 of the M stacked layers (i.e., $S_1$ and $S_2$) in the lower portion. This may sufficiently expose the N stacked layers (i.e., $S_3$ and $S_4$) in the upper portion so as to release the channel portion.

Here, M and N may be adjusted by controlling the depth of the etching back of the mask layer 1015. For example, if the depth of the etching back is small, N is small and M is large, and if the depth of the etching back is large, N is large and M is small. Here, both M and N are natural numbers greater than zero.

Figure 10A:
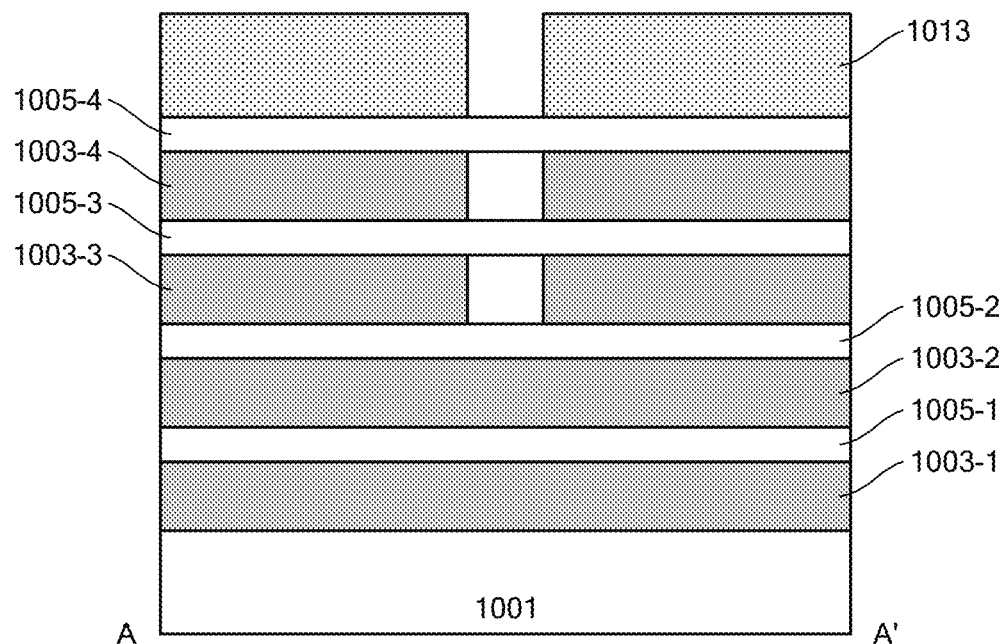
Figure 10B:
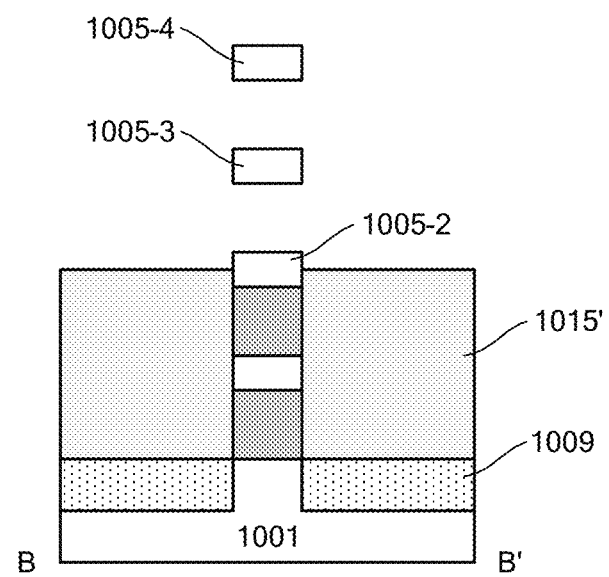

For the exposed N stacked layers (i.e., $S_3$ and $S_4$), the channel portion may be released. For example, as shown in FIG. 10(a) and FIG. 10(b), at least one type of semiconductor layer in each stacked layer $S_3$, $S_4$ may be removed by selective etching, while at least one type of another semiconductor layer may be remained. For example, the first semiconductor layers 1003-3, 1003-4 in each stacked layer $S_3$, $S_4$ may be removed, while the second semiconductor layers 1005-3, 1005-4 may be remained. In this way, middle portions of the second semiconductor layers 1005-3 and 1005-4 (the portion originally covered by the dummy gate 1011) may be formed in a suspended form, and the channel portion thus defined may be surrounded by a gate stack from four sides so as to form a GAA structure. The second semiconductor layers 1005-3, 1005-4 whose middle portions serving as the channel portion may contain a suitable semiconductor material, such as $Si$ or $Si_{1-x}Ge_x$ as described above. In the case of $Si_{1-x}Ge_x$, a mobility is higher, which is beneficial to an improvement of the device performance. Of course, considering a consistency of the device performance, the N stacked layers (i.e., $S_3$ and $S_4$) in the upper portion may have the same configuration, so that the same semiconductor layer in each of the N stacked layers may be released so as to define the channel portion.

The M stacked layers (i.e., $S_1$ and $S_2$) in the lower portion are covered by the mask layer 1015', and thus may remain substantially unaffected and may form a fin-shaped structure protruding with respect to the substrate 1001. After that, the mask layer 1015' may be removed by selective etching. Dry etching or wet etching may be used for the selective etching. For example, oxygen plasma may be used in the case of SOC or APF, and an alkaline solution such as ammonia water (e.g., about 60 to 70° C., with a concentration of greater than 1:100) may be used in the case of amorphous silicon.

After that, the gate stack may be manufactured.

Figure 11A:
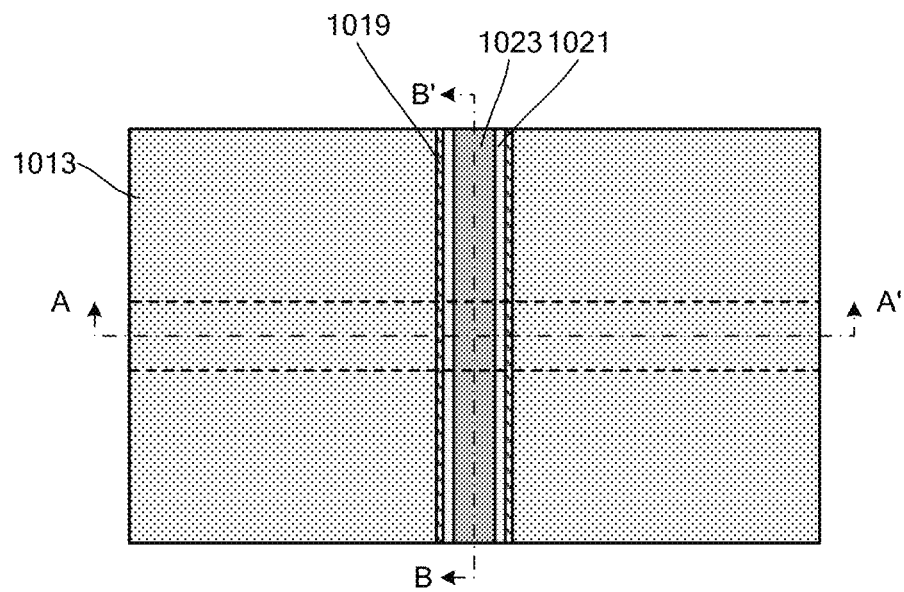
Figure 11B:
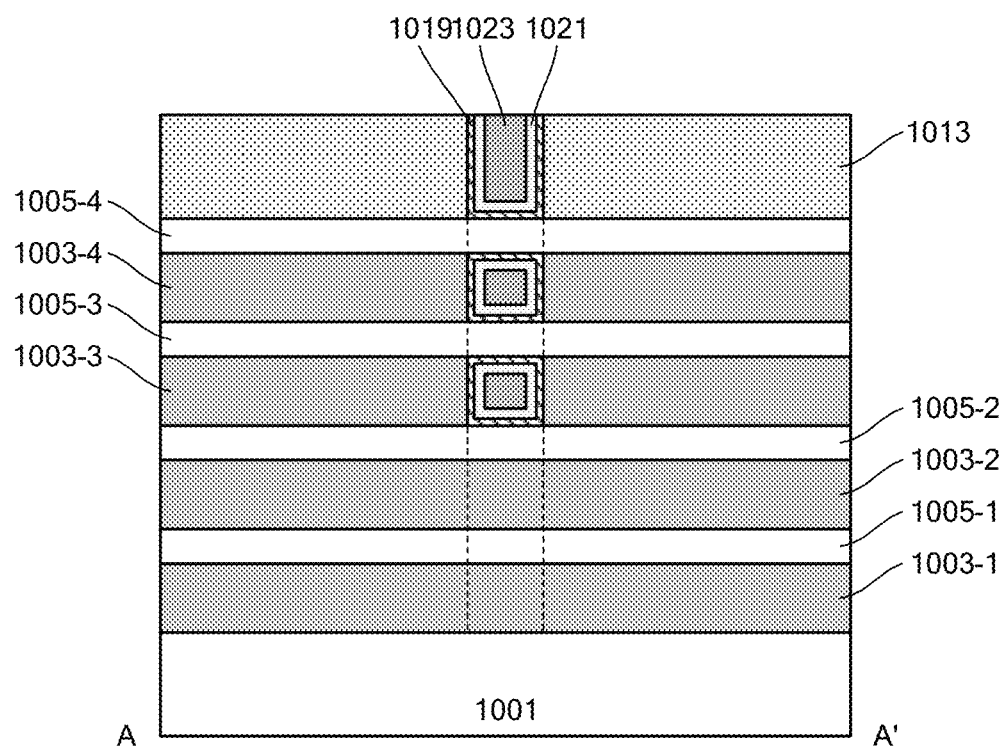
Figure 11C:
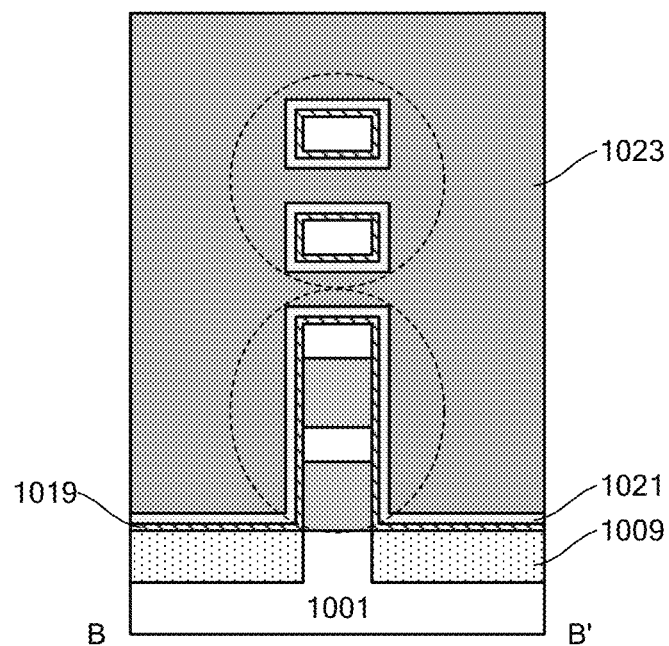

For example, as shown in FIG. 11(a), FIG. 11(b) and FIG. 11(c), a gate dielectric layer 1019 and a gate metal layer (for example, including a work function adjustment layer 1021 and a gate conductor layer 1023) may be formed in sequence in the gate trench. For example, the gate dielectric layer 1019 may contain a high-k gate dielectric such as $HfO_2$, $Al_2O_3$ and $ZrO_2$, or a stacked layer thereof. The work function adjustment layer 1021 may contain TiN, TiAlN, TaN, etc. or a stacked layer thereof such as TiN/TaN/TiN, TiN/TaN/TiN/TiAlN/TiN or the like. The gate conductor layer 1023 may contain W, Co, Ru, or the like. Before the high-k gate dielectric is formed, an interface layer may also be formed by, for example, an oxidation process or by depositing an oxide formed by atomic layer deposition (ALD).

In addition, before the gate stack is manufactured, an inner spacer (not shown) may be formed on sidewalls of the first semiconductor layers 1003-3 and 1003-4 in the upper portion exposed due to the operation of releasing the channel portion. The inner spacer and the method of manufacturing the inner spacer may be the same as those in the conventional technology, which are not repeated here.

As shown in a dashed circle in FIG. 11(c), the channel portion of the semiconductor device thus obtained may include the upper portion and the lower portion. In the upper portion, the channel portion is in the form of nanosheets or nanowires separated from each other, the number of the nanosheets or of nanowires is N, and they are respectively surrounded by the gate stack, so that the GAA configuration is formed. In the lower portion, the channel portion is in a fin-shaped structure protruding with respect to the substrate 1001, and the gate stack surrounds the sidewall and the top surface of the fin-shaped structure, so that it resembles a FinFET configuration. Therefore, on one hand, with the GAA configuration in the upper portion, a steeper SS characteristic may be achieved; and on the other hand, with the FinFET configuration in the lower portion, the driving performance may be enhanced. Moreover, the upper and lower portions of the semiconductor device are identical in the manufacturing process, except that the operation of releasing the channel portion is additionally performed on the upper portion.

In addition, as shown in FIG. 11(b), positions of the source/drain portions and the channel portion are schematically shown in dotted lines. Specifically, the channel portion is located in the middle, and the source/drain portions are located on two opposite sides of the channel portion. Although the channel portion exhibit different forms in the upper portion and the lower portion as described above, the source/drain portion on each side is integral.

As the channel portion exhibits different forms in the upper portion and the lower portion, in order to optimize the device performance, the configuration of the gate stack may also be optimized for the upper portion and the lower portion.

The gate stack (gate dielectric layer 1019/work function adjustment layer 1021/gate conductor layer 1023) formed above may be provided for the channel portion in the lower portion, so as to achieve a certain equivalent work function or threshold voltage (Vt). For the channel portion in the upper portion, a different gate stack may be additionally provided. For example, at least one of the gate dielectric layer and the gate metal layer (including the work function adjustment layer and the gate conductor layer) is different, so as to achieve a certain equivalent work function or threshold voltage (Vt). The entire semiconductor device may have a substantially consistent threshold voltage (Vt).

Figure 12A:
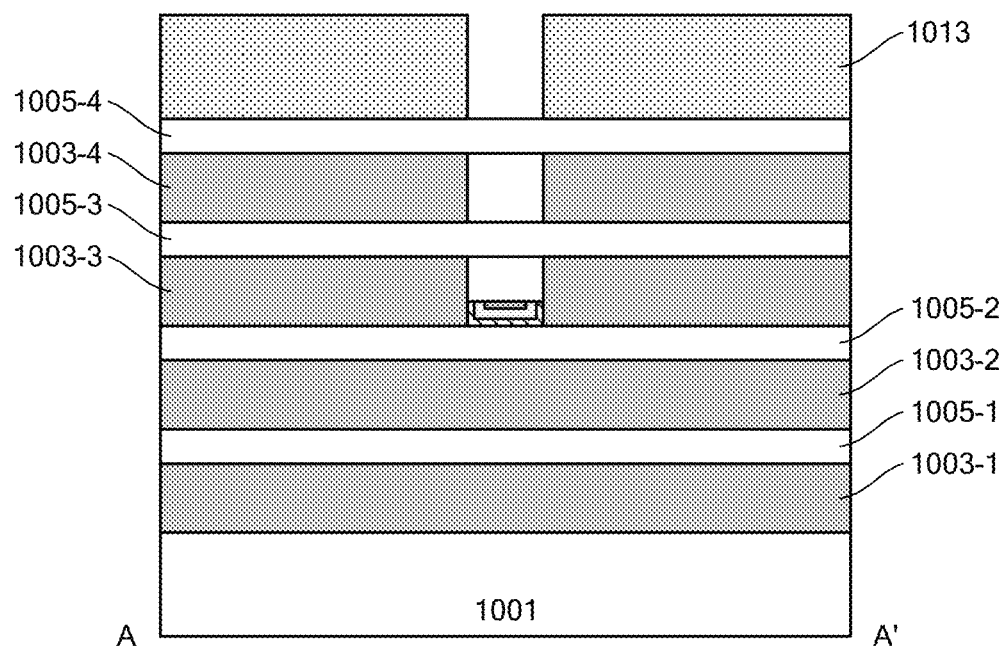
Figure 12B:
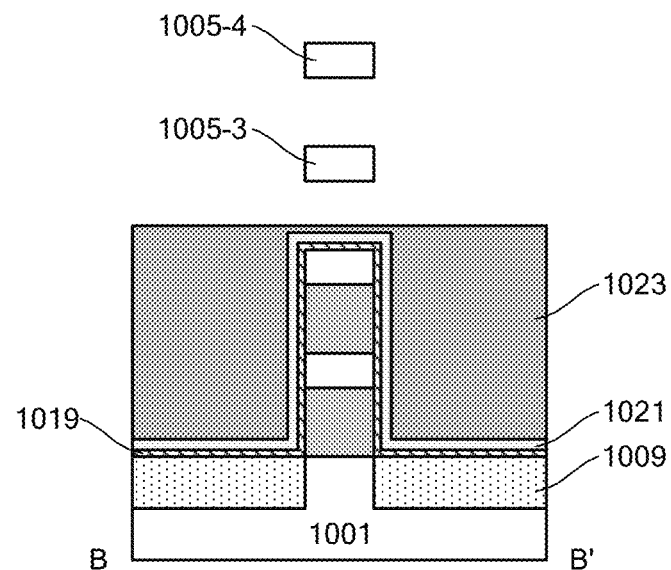

For example, as shown in FIG. 12(a) and FIG. 12(b), the previously formed gate stack may be etched back to expose the channel portion in the upper portion. In this example, the situation that both the gate dielectric layer 1019 and the gate metal layer (including the work function adjustment layer 1021 and the gate conductor layer 1023) are etched back is shown. However, the present disclosure is not limited to this. For example, it is possible that only the gate metal layer is etched back, while the gate dielectric layer 1019 is remained.

Figure 13A:
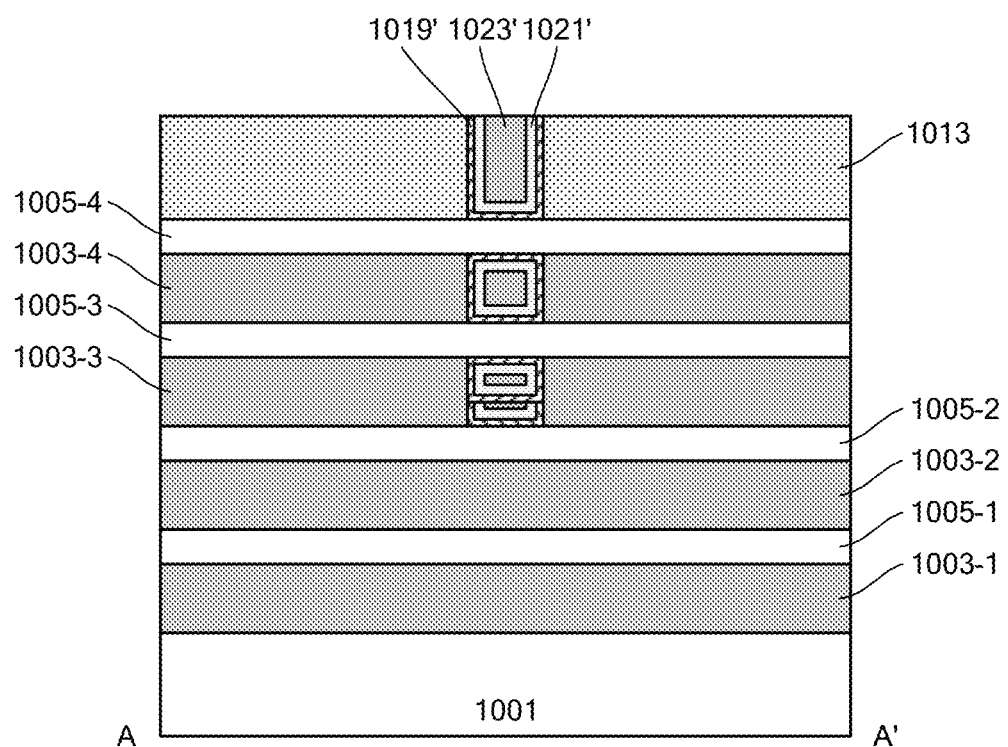
Figure 13B:
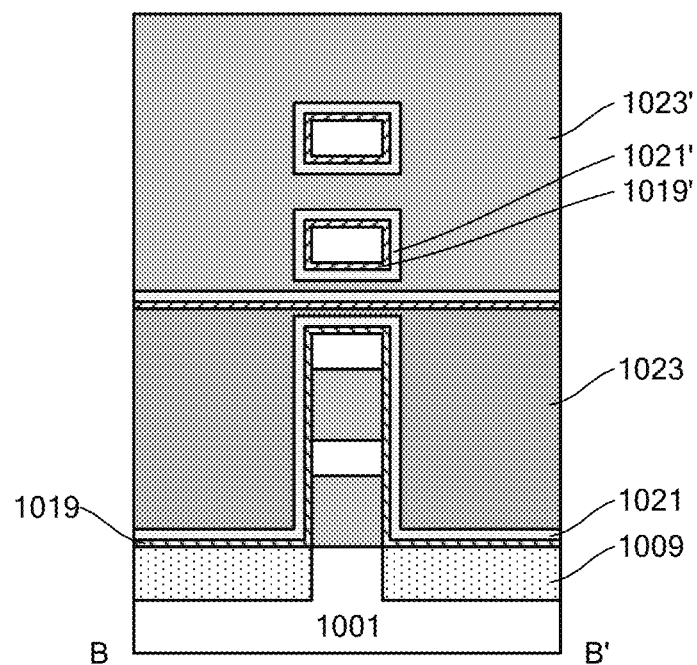

After that, as shown in FIG. 13(a) and FIG. 13 (b), another gate stack may be formed likewise in a space in the interlayer dielectric layer 1013 caused due to the etching back, and the gate stack may include a gate dielectric layer 1019' (no additional formation is required in the situation that the gate dielectric layer 1019 is remained) and a gate metal layer (including a work function adjustment layer 1021' and a gate conductor layer 1023'). In addition, the gate conductor layer 1023' may contain the same material as the gate conductor layer 1023, so that the work function or Vt may be adjusted through the work function adjustment layer 1021'.

In the situation that the gate dielectric layer 1019' is additionally formed, the previously and later formed gate conductor layers may be separated by the gate dielectric layer 1019'. The gate conductor layers may be connected with each other by interconnection in a subsequent metallization process.

In the above embodiment, the gate stack is formed after the channel portion is released. However, the present disclosure is not limited to this.

Figure 14:
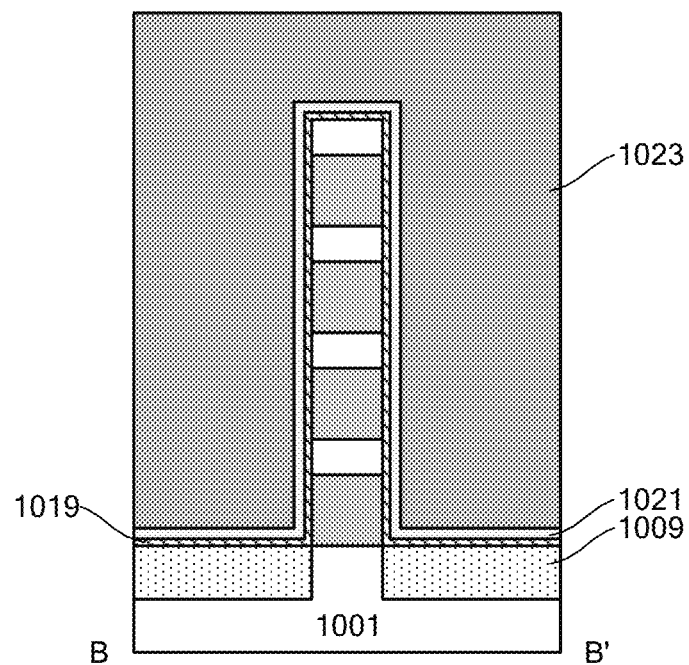
Figure 15:
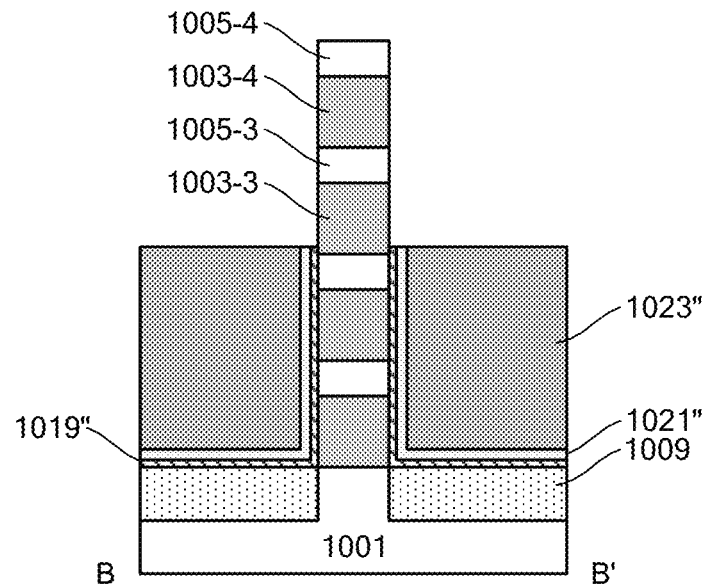
Figure 16:
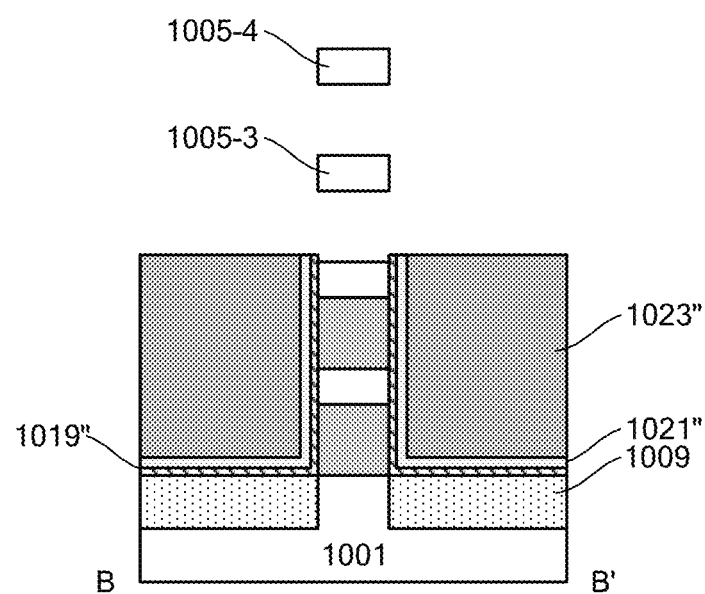
Figure 17:
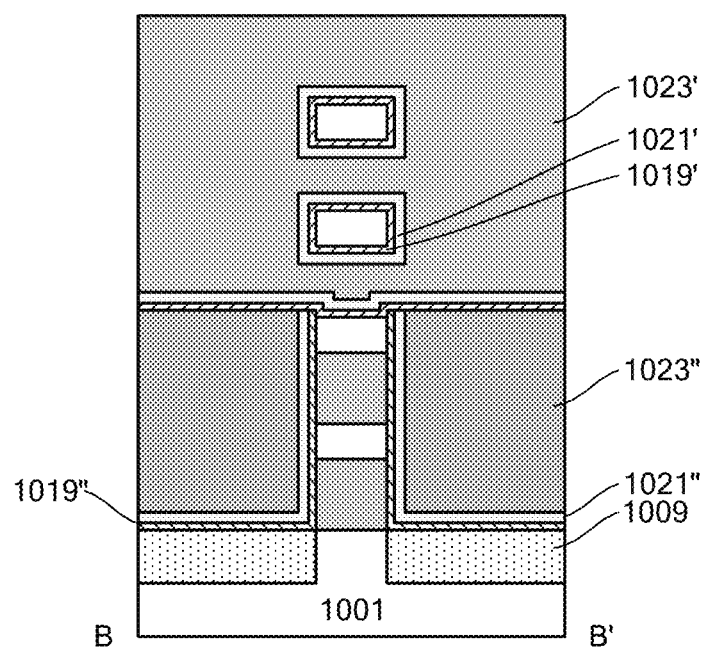

For example, as shown in FIG. 14, the gate stack (gate dielectric layer 1019/work function adjustment layer 1021/gate conductor layer 1023) may be directly formed without releasing the channel portion for the upper portion. Then, as shown in FIG. 15, the gate stack may be etched back to lower the top surface thereof and expose the N stacked layers (i.e., $S_3$ and $S_4$) in the upper portion. That is, in this embodiment, the gate stack may be used as the mask layer in the operation of releasing the channel portion without additionally forming the mask layer 1015 as described above. Here, a top surface of a gate stack (gate dielectric layer 1019"/work function adjustment layer 1021"/gate conductor layer 1023") after etching back may be (slightly) higher than the top surface of the uppermost semiconductor layer 1009 of the M stacked layers (i.e., $S_1$ and $S_2$) in the lower portion. This allows the gate stack (gate dielectric layer 1019"/work function adjusting layer 1021"/gate conductor layer 1023") after etching back to better cover entire sidewalls of the M stacked layer in the lower portion. As shown in FIG. 16, for the exposed stacked layers, the channel portion may be released as described above. After that, as shown in FIG. 17, another gate stack may be formed, including a gate dielectric layer 1019', a work function adjustment layer 1021' and a gate conductor layer 1023'. Here, the previously and later formed gate stacks may have the same configuration, or configurations different from each other.

The semiconductor device according to the embodiments of the present disclosure may be applied to various electronic apparatuses. For example, an integrated circuit (IC) may be formed based on such semiconductor device, and an electronic apparatus may be constructed therefrom. Therefore, according to the present disclosure, there is also provided an electronic apparatus including the above-mentioned semiconductor device. The electronic apparatus may also include components such as a display cooperating with the integrated circuit and a wireless transceiver cooperating with the integrated circuit. Such electronic apparatus may be, for example, a smart phone, a computer, a tablet computer, a wearable smart apparatus, an artificial intelligence apparatus, a mobile power or the like.

According to the embodiments of the present disclosure, there is also provided a method of manufacturing a system on a chip (SoC). The method may include the method described above. Specifically, a plurality of devices may be integrated on a chip, and at least some of which are manufactured according to the method of the present disclosure.

In the above descriptions, technical details such as patterning and etching of each layer are not described in detail. However, those skilled in the art should understand that various technical means may be used to form layers, regions, etc. of desired shapes. In addition, in order to form the same structure, those skilled in the art may also design a method that is not exactly the same as those described above. In addition, although the various embodiments are described above separately, this does not mean that the measurements in the various embodiments may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A semiconductor device, comprising:
   a substrate; and
   a channel portion, comprising:
      a first portion comprising a fin-shaped structure protruding with respect to the substrate;
      a second portion located above the first portion and spaced apart from the first portion, wherein the second portion comprises one or more nanowires or nanosheets spaced apart from each other;
      source/drain portions arranged on two opposite sides of the channel portion in a first direction and being in contact with the channel portion; and
      a gate stack extending on the substrate in a second direction intersecting with the first direction, so as to intersect with the channel portion
   wherein the gate stack comprises:
      a first portion intersecting with the first portion of the channel portion; and
      a second portion intersecting with the second portion of the channel portion;
   wherein the first portion of the gate stack comprises a first gate dielectric layer and a first gate metal layer;
   wherein the second portion of the gate stack comprises a second gate dielectric layer and a second gate metal layer; and
   wherein the first gate dielectric layer is different from the second gate dielectric layer and/or the first gate metal layer is different from the second gate metal layer.

2. The semiconductor device according to claim 1, wherein the first portion of the channel portion comprises a stacked layer of a plurality of semiconductor layers.

3. The semiconductor device according to claim 1, wherein the first portion of the channel portion comprises an alternating stack of a first semiconductor layer and a second semiconductor layer, and each of the nanowires or nanosheets comprises one of the first semiconductor layer or the second semiconductor layer.

4. The semiconductor device according to claim 3, wherein:
   the first semiconductor layer and the second semiconductor layer respectively comprise Si and $Si_{1-x}Ge_x$, or respectively comprise Si and Ge, or respectively comprise Ge and $Si_{1-x}Ge_x$, wherein $0<x<1$, and
   wherein the nanowires or nanosheets comprise Si, $Si_{1-x}Ge_x$ or Ge, wherein $0<x<1$.

5. The semiconductor device according to claim 1, wherein the first portion and the second portion of the channel portion are self-aligned in a vertical direction.

6. The semiconductor device according to claim 1, wherein the gate stack covers a top surface and opposite sidewalls in the second direction of the first portion of the channel portion, and surrounds the nanowires or nanosheets of the second portion of the channel portion.

7. The semiconductor device according to claim 1, wherein the first portion of the gate stack and the second portion of the gate stack have different configurations, so that the first portion of the channel portion and the second portion of the channel portion have a substantially equal threshold voltage.

8. The semiconductor device according to claim 1, wherein the first portion of the gate stack covers the top surface and the opposite sidewalls in the second direction of the first portion of the channel portion, and the second portion of the gate stack surrounds the nanowires or nanosheets.

9. The semiconductor device according to claim 1, wherein the first portion of the gate stack covers the opposite sidewalls in the second direction of the first portion of the channel portion, and the second portion of the gate stack surrounds the nanowires or nanosheets and covers the top surface of the first portion of the channel portion.

10. A method of manufacturing a semiconductor device, comprising:
   arranging a ridge-shaped structure extending along a first direction on a substrate, wherein the ridge-shaped structure comprises a first stacked layer of a plurality of semiconductor layers at least on an upper portion of the ridge-shaped structure;

forming a dummy gate extending in a second direction intersecting with the first direction on the substrate, so as to intersect with the ridge-shaped structure;

forming an interlayer dielectric layer on the substrate, wherein the interlayer dielectric layer exposes the dummy gate;

removing the dummy gate to form a gate trench in the interlayer dielectric layer;

removing a portion of the semiconductor layer from the first stacked layer of the ridge-shaped structure in the gate trench to form one or more nanowires or nanosheets separated from each other, wherein a lower portion of the ridge-shaped structure is separated from the nanowires or nanosheets to form a fin-shaped structure; and forming a gate stack in the gate trench so as to intersect with the nanowires or nanosheets and the fin-shaped structure, wherein the removing a portion of the semiconductor layer from the first stacked layer of the ridge-shaped structure comprises:

forming a mask layer in the gate trench to shield the lower portion of the ridge-shaped structure;

removing the portion of the semiconductor layer from the first stacked layer by selective etching; and removing the mask layer.

11. The method according to claim 10, wherein the arranging a ridge-shaped structure comprises:

forming a semiconductor layer or a second stacked layer of a plurality of semiconductor layers by epitaxial growth, and forming the first stacked layer on the semiconductor layer or the second stacked layer.

12. The method according to claim 11, wherein each of the nanowires or nanosheets comprises a same material as the semiconductor layer or at least one of the plurality of semiconductor layers in the second stacked layer.

13. The method according to claim 10, wherein the arranging a ridge-shaped structure comprises forming a second stacked layer of a plurality of semiconductor layers by epitaxial growth, and forming the first stacked layer on the second stacked layer, and wherein:

the first stacked layer and the second stacked layer each comprise an alternating stack of a first semiconductor layer and a second semiconductor layer, and wherein the nanowires or nanosheets each comprises one of the first semiconductor layer and the second semiconductor layer.

14. The method according to claim 10, wherein the forming a gate stack comprises:

forming a first gate dielectric layer and a first gate metal layer in sequence in the gate trench.

15. The method according to claim 14, further comprising:

recessing the first gate metal layer to expose the nanowires or nanosheets; and further forming a second gate metal layer in the gate trench to surround the nanowires or nanosheets.

16. The method according to claim 15, wherein:

in an operation of exposing the nanowires or nanosheets, the method further comprises: recessing the first gate dielectric layer, and wherein the method further comprises: further forming a second gate dielectric layer in the gate trench, wherein the second gate metal layer is formed on the second gate dielectric layer.

17. The method according to claim 10, wherein:

the removing a portion of the semiconductor layer from the first stacked layer of the ridge-shaped structure comprises:

forming a first gate dielectric layer and a first gate metal layer in sequence in the gate trench;

recessing the first gate dielectric layer and the first gate metal layer to expose the first stacked layer; and removing the portion of the semiconductor layer from the first stacked layer by selective etching, and wherein the forming a gate stack comprises:

further forming a second gate dielectric layer and a second gate metal layer in sequence in the gate trench to surround the nanowires or nanosheets.

* * * * *